United States Patent
Chang et al.

(10) Patent No.: US 12,287,581 B2
(45) Date of Patent: Apr. 29, 2025

(54) METHOD OF MANUFACTURING SEMICONDUCTOR DEVICES USING A PHOTOMASK

(71) Applicant: TAIWAN SEMICONDUCTOR MANUFACTURING COMPANY, LTD., Hsinchu (TW)

(72) Inventors: Chung-Hao Chang, Hsinchu (TW); Ming-Wei Chen, Hsinchu (TW); Ai-Jay Ma, Taoyuan County (TW); Ching-Yueh Chen, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 532 days.

(21) Appl. No.: 17/566,301

(22) Filed: Dec. 30, 2021

(65) Prior Publication Data
US 2022/0382168 A1    Dec. 1, 2022

Related U.S. Application Data

(60) Provisional application No. 63/194,397, filed on May 28, 2021.

(51) Int. Cl.
*G03F 7/00* (2006.01)
(52) U.S. Cl.
CPC ...... *G03F 7/70358* (2013.01); *G03F 7/70875* (2013.01); *G03F 7/0035* (2013.01)

(58) Field of Classification Search
CPC .................................... G03F 1/22; G03F 1/24
See application file for complete search history.

(56) References Cited

U.S. PATENT DOCUMENTS

| | | | |
|---|---|---|---|
| 8,796,666 | B1 | 8/2014 | Huang et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 9,618,837 | B2 | 4/2017 | Lu et al. |
| 9,869,928 | B2 | 1/2018 | Huang et al. |
| 9,869,934 | B2 | 1/2018 | Huang et al. |
| 9,869,939 | B2 | 1/2018 | Yu et al. |

(Continued)

FOREIGN PATENT DOCUMENTS

| | | |
|---|---|---|
| CN | 106507684 A | 3/2017 |
| CN | 110967925 A | 4/2020 |

(Continued)

*Primary Examiner* — Martin J Angebranndt
(74) *Attorney, Agent, or Firm* — STUDEBAKER BRACKETT PLLC

(57) ABSTRACT

In a method of manufacturing a semiconductor device, in an EUV scanner, an EUV lithography operation using an EUV mask is performed on a photo resist layer formed over a semiconductor substrate. After the EUV lithography operation, the EUV mask is unloaded from a mask stage of the EUV scanner. The EUV mask is placed under a reduced pressure below an atmospheric pressure. The EUV mask is heated under the reduced pressure at a first temperature in a range from 100° C. to 350 C°. After the heating, the EUV mask is stored in a mask stocker.

20 Claims, 17 Drawing Sheets

(56) References Cited

U.S. PATENT DOCUMENTS

| | | | |
|---|---|---|---|
| 11,360,384 B2 | 6/2022 | Yang et al. | |
| 11,822,256 B2 * | 11/2023 | Chang | G03F 7/70741 |
| 2005/0058836 A1 * | 3/2005 | Goldstein | B24C 3/322 |
| | | | 239/128 |
| 2005/0277031 A1 * | 12/2005 | Yan | B82Y 40/00 |
| | | | 430/5 |
| 2007/0030466 A1 * | 2/2007 | Shuichi | G03F 7/70916 |
| | | | 355/53 |
| 2012/0182538 A1 * | 7/2012 | Koole | G03F 1/84 |
| | | | 355/75 |
| 2013/0063707 A1 * | 3/2013 | Aburada | G03F 7/70941 |
| | | | 355/53 |
| 2014/0268074 A1 * | 9/2014 | Chien | G03F 7/70741 |
| | | | 355/30 |
| 2014/0362366 A1 * | 12/2014 | Delgado | G01N 21/9501 |
| | | | 355/30 |
| 2015/0190851 A1 * | 7/2015 | Itoh | B05D 5/00 |
| | | | 15/104.002 |
| 2021/0364906 A1 * | 11/2021 | Hsu | G03F 1/24 |

FOREIGN PATENT DOCUMENTS

| | | | | | |
|---|---|---|---|---|---|
| JP | 11209840 | A | * | 8/1999 | ............ C22C 45/00 |
| JP | 3305458 | B2 | * | 7/2002 | |
| JP | 2005274770 | A | * | 10/2005 | |
| TW | 202032739 | A | | 9/2020 | |
| TW | 202105695 | A | | 2/2021 | |
| TW | 202115501 | A | | 4/2021 | |
| WO | WO-2020256062 | A1 | * | 12/2020 | ............... G03F 1/24 |

\* cited by examiner

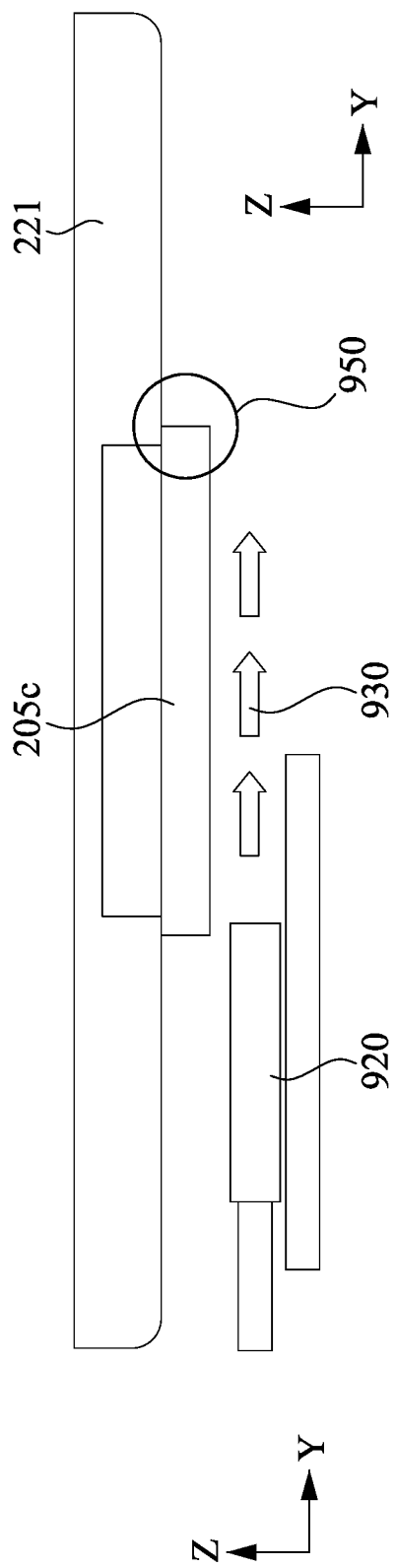

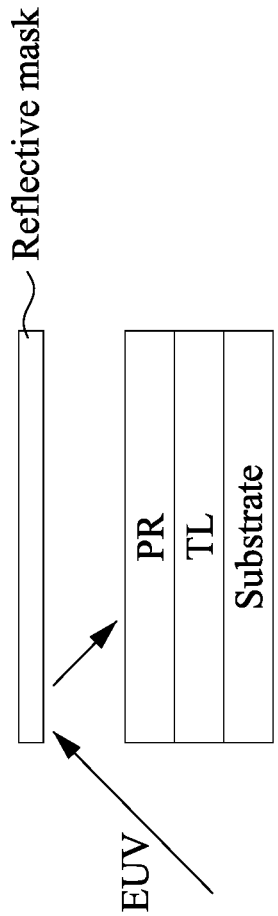
Fig. 14B
Fig. 14C
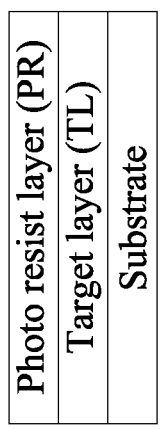
Fig. 14D
Fig. 14E
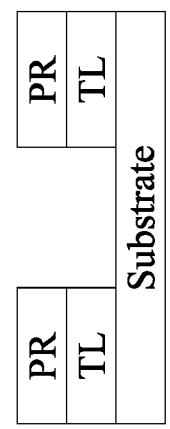

METHOD OF MANUFACTURING SEMICONDUCTOR DEVICES USING A PHOTOMASK

CROSS-REFERENCE TO RELATED APPLICATIONS

This application claims priority to U.S. Provisional Patent Application No. 63/194,397 filed May 28, 2021, the entire disclosure of which is incorporated herein by reference.

BACKGROUND

As the semiconductor industry has progressed into nanometer technology process nodes in pursuit of higher device density, higher performance, and lower costs, challenges from both fabrication and design issues become greater. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. Photolithography operations are one of the key operations in the semiconductor manufacturing process. Photolithography techniques include ultraviolet lithography, deep ultraviolet lithography, and extreme ultraviolet lithography (EUVL). The photomask is an important component in photolithography operations. It is critical to fabricate and maintain photomasks free of resolvable defects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A shows a schematic diagram and FIG. 2B shows a schematic diagram of a detail of an extreme ultraviolet lithography tool.

FIGS. 14B, 14C, 14D and 14E show a sequential manufacturing operation of a method of making a semiconductor device in accordance with embodiments of present disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Materials, configurations, dimensions, process and/or operations explained with one embodiment can be applied to other embodiments, and the detailed explanation thereof may be omitted.

The present disclosure is generally related to extreme ultraviolet (EUV) lithography masks and methods. In an EUVL tool, a laser-produced plasma (LPP) generates extreme ultraviolet radiation which is used to image a photoresist-coated substrate. In an EUV tool, an excitation laser heats metal (e.g., tin, lithium, etc.) target droplets in the LPP chamber to ionize the droplets to plasma, which emits the EUV radiation. For reproducible generation of EUV radiation, the target droplets arriving at the focal point (also referred to herein as the "zone of excitation") have to be substantially the same size and arrive at the zone of excitation at the same time as an excitation pulse from the excitation laser arrives. Thus, stable generation of target droplets that travel from the target droplet generator to the zone of excitation at a uniform (or predictable) speed contributes to efficiency and stability of the LPP EUV radiation source.

Figure 1:
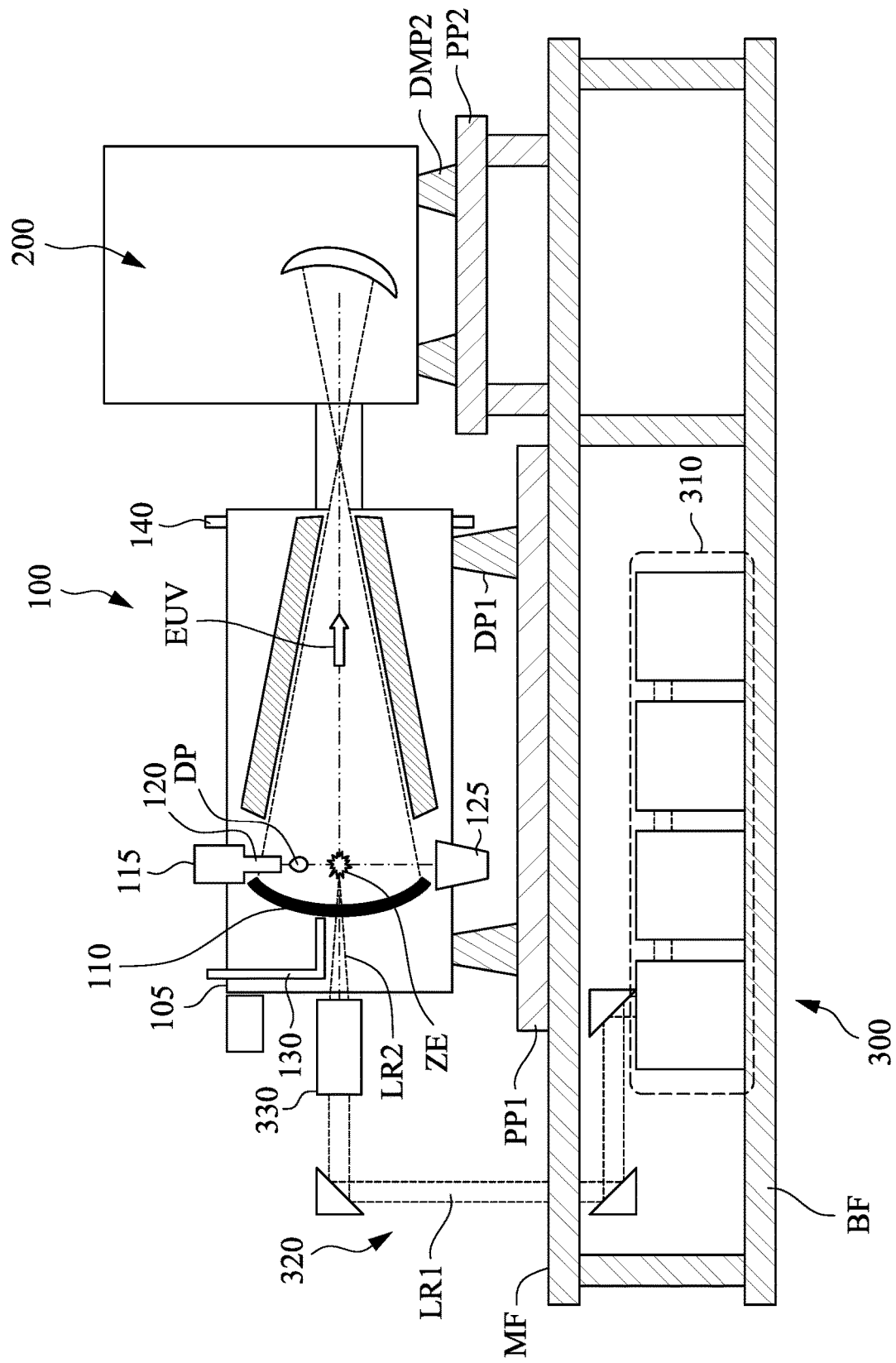
FIG. 1 shows an extreme ultraviolet lithography tool.

FIG. 1 is a schematic view of an EUV lithography tool with a laser production plasma (LPP) based EUV radiation source, constructed in accordance with some embodiments of the present disclosure. The EUV lithography system includes an EUV radiation source 100 to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DP1 and DMP2, respectively. The EUV radiation source 100 and the exposure device 200 are coupled to each other by a coupling mechanism, which may include a focusing unit.

The EUV lithography tool is designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a photomask secured on the mask stage. In some embodiments, the mask stage includes an electrostatic chuck (e-chuck) to secure the photomask.

Figure 2A:
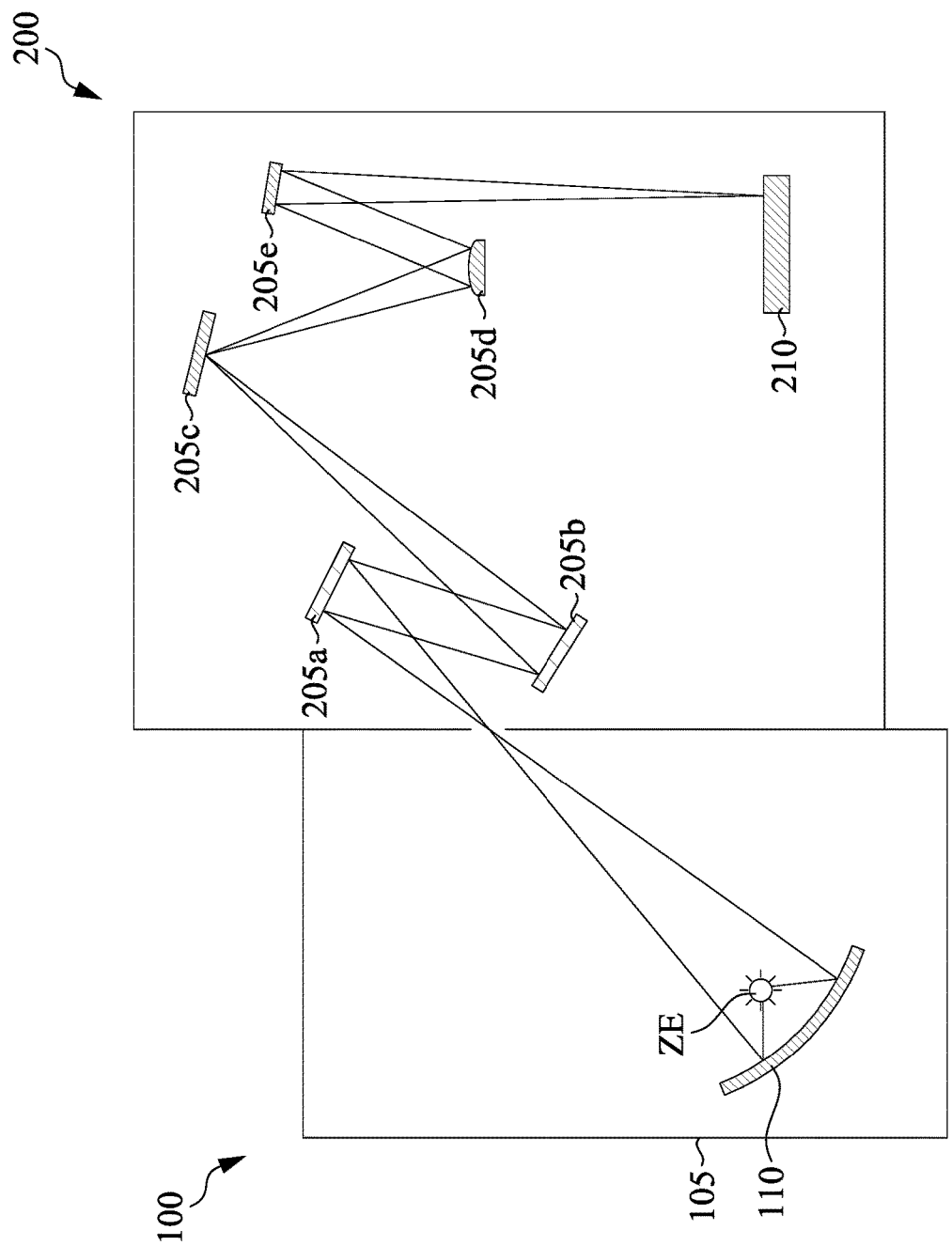

FIG. 2A is a simplified schematic diagram of an extreme ultraviolet lithography tool and FIG. 2B shows a schematic diagram of a detail of an extreme ultraviolet lithography tool according to an embodiment of the disclosure showing the exposure of a photoresist-coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a photomask, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIGS. 2A and 2B, the EUVL tool includes an EUV light source 100 including an EUV light radiator ZE emitting EUV light in a chamber 105 that is reflected by a collector 110 along a path into the exposure device 200 to irradiate the substrate 210.

In some embodiments, the photomask (reticle) 205c is held by an electrostatic chuck 221, which are positioned such that radiation EUV supplied from the EUV radiation source is in focus when it arrives at the surface of the semiconductor wafer. In some embodiments, a hydrogen gas flow is provided along the surface of the photomask 205c. In some embodiments, a nozzle 920 is mounted that ejects hydrogen 930 along the Y-axis. The Y-axis is perpendicular to the X-axis of the photomask, an axis along the motion by the hydrogen and perpendicular to the Z-axis, which is the axis substantially normal to the surface of the reticle.

The nozzle 920 is a nozzle configured to eject gas (e.g., hydrogen) along the Y-axis. During the EUV lithography process, the hydrogen flow 930 ejected by the nozzle 920 along the Y-axis drifts towards a surface of the reticle due to its light molecular weight. Because the hydrogen is lighter than air, is rises in a vertical direction relative to the air. The drifted hydrogen 930 accumulates/deposits at the edge 950 of the reticle 205c, permeating into the space between the reticle and a covering film.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is not meant to be limited to components which operate solely or to advantage within one or more specific wavelength range(s) such as at the EUV output light wavelength, the irradiation laser wavelength, a wavelength suitable for metrology or any other specific wavelength.

Because gas molecules absorb EUV light, the lithography system for the EUV lithography patterning is maintained in a vacuum or a-low pressure environment to avoid EUV intensity loss.

Figure 3:
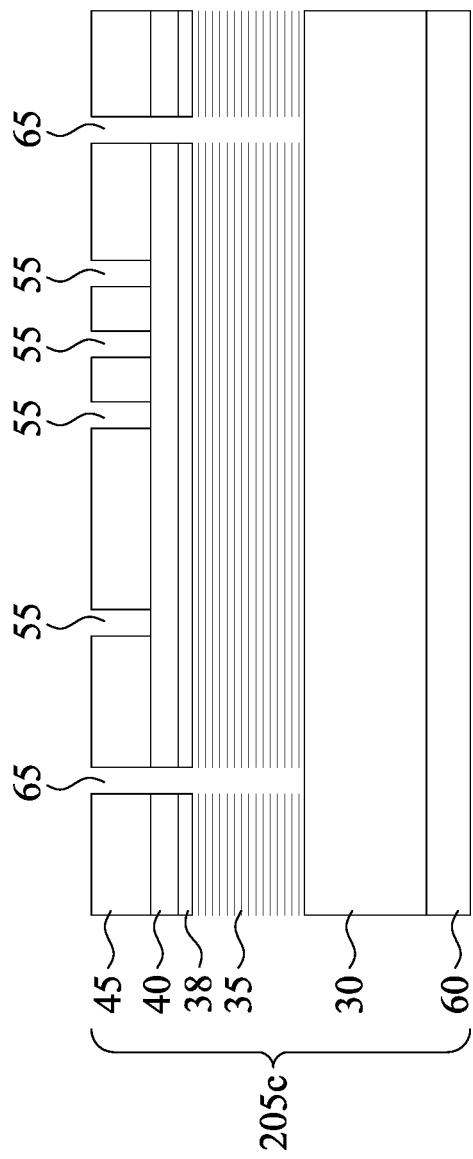
FIG. 3 is a cross-sectional view of a reflective mask.

In the present disclosure, the terms mask, photomask, and reticle are used interchangeably. In the present embodiment, the patterning optic 205c shown in FIG. 3 is a reflective photomask. In an embodiment, the reflective reticle 205c includes a substrate 30 with a suitable material, such as a low thermal expansion material or fused quartz, as shown in FIG. 3. In various examples, the material includes $TiO_2$ doped $SiO_2$, or other suitable materials with low thermal expansion. In some embodiments, the low thermal expansion glass substrate transmits light at visible wavelengths, a portion of the infrared wavelengths near the visible spectrum (near-infrared), and a portion of the ultraviolet wavelengths. In some embodiments, the low thermal expansion glass substrate absorbs extreme ultraviolet wavelengths and deep ultraviolet wavelengths near the extreme ultraviolet.

The reflective reticle 205c includes multiple reflective layers 35 deposited on the substrate. The multiple reflective layers 35 includes a plurality of film pairs, such as molybdenum-silicon (Mo/Si) film pairs (e.g., a layer of molybdenum 39 above or below a layer of silicon 37 in each film pair). Alternatively, the multiple reflective layers 35 may include molybdenum-beryllium (Mo/Be) film pairs, or other suitable materials that are configured to highly reflect the EUV light. In some embodiments, the Mo/Si multilayer stack 35 includes from about 30 alternating layers each of silicon and molybdenum to about 60 alternating layers each of silicon and molybdenum. In some embodiments, from about 35 to about 50 alternating layers each of silicon and molybdenum are formed. In certain embodiments, there are about 40 alternating layers each of silicon and molybdenum. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. Each layer of silicon and molybdenum is about 2 nm to about 10 nm thick. In some embodiments, the layers of silicon and molybdenum are about the same thickness. In other embodiments, the layers of silicon and molybdenum are different thicknesses. In some embodiments, the thickness of each layer of silicon and molybdenum is about 3 nm to about 4 nm.

The mask 205c may further include a capping layer 40, such as a layer made of ruthenium (Ru) for protection of the multilayer 35. The capping layer 40 is disposed over the Mo/Si multilayer 35. In some embodiments, the capping layer 40 is made of ruthenium having a thickness of from about 2 nm to about 10 nm. In certain embodiments, the thickness of the capping layer 40 is from about 2 nm to about 4 nm. In some embodiments, the capping layer 40 is formed by chemical vapor deposition, plasma-enhanced chemical vapor deposition, atomic layer deposition, physical vapor deposition, or any other suitable film forming method.

In some embodiments, a reflection mirror layer 38 is disposed between the multiple reflective layers 35 and the capping layer 40. In some embodiments, the reflection mirror layer 38 includes an oxide layer made of an oxide of, for example, silicon. In some embodiments, the oxide layer is formed by a deposition method as shown above, or oxidation of a top Si layer of reflective layers 35. In some embodiments, the thickness of the reflection mirror layer 38 is in a range from about 2 nm to about 10 nm.

The mask further includes an absorption (or absorber) layer 45. The absorber layer 45 is disposed over the capping layer 40 in some embodiments. The absorption layer 45 is patterned to define a layer of an integrated circuit (IC). In some embodiments, the absorber layer 45 is Ta-based material. In some embodiments, the absorber layer is made of TaN, TaO, TaBN, or TaBO having a thickness from about 25 nm to about 100 nm. In certain embodiments, the absorber layer 45 thickness ranges from about 50 nm to about 75 nm. In some embodiments, the absorber layer 45 is formed by chemical vapor deposition, plasma-enhanced chemical vapor deposition, atomic layer deposition, physical vapor deposition, or any other suitable film forming method.

In some embodiments, an antireflective layer (not shown) is optionally formed over the absorber layer 45. The antireflective layer has a thickness of from about 2 nm to about 10 nm. In some embodiments, the thickness of the antireflective layer is from about 3 nm to about 6 nm. In some embodiments, the antireflective layer is formed by chemical vapor deposition, plasma-enhanced chemical vapor deposition, atomic layer deposition, physical vapor deposition, or any other suitable film forming method. EUV masks require very low surface roughness and must have no resolvable defects.

The reflective mask 205c includes a backside conductive layer 60 in some embodiments. In some embodiments, the conductive layer 60 is formed on a second main surface of the substrate 30 opposing the first main surface of the substrate 30 on which the Mo/Si multilayer 35 is formed. In some embodiments, the conductive layer 60 is made of chromium, chromium nitride, or TaB having a thickness of about 25 nm to about 150 nm. In some embodiments, the conductive layer 60 has a thickness of about 70 nm to about 100 nm. In some embodiments, the conductive layer 60 is formed by chemical vapor deposition, plasma-enhanced chemical vapor deposition, atomic layer deposition, physical vapor deposition, or any other suitable film forming method.

In some embodiments, the reflective mask 205c includes a border 65 etched down to the substrate 30 surrounding the pattern 55, also known as a black border 65, to define a circuit area to be imaged and a peripheral area not to be imaged. The black border reduces light leakage in some embodiments.

In various embodiments of the present disclosure, the photoresist-coated substrate 210 is a semiconductor wafer, such as a silicon wafer or other type of wafer to be patterned.

The EUVL tool further includes other modules or is integrated with (or coupled with) other modules in some embodiments. In addition, the EUVL system includes a radiation source, the EUV exposure tool (scanner) and a photomask stocker (reticle library) for storing multiple photomasks under an inert gas ambient.

As shown in FIG. 1, the EUV radiation source 100 includes a target droplet generator 115 and a LPP collector 110, enclosed by a chamber 105. In some embodiments, the target droplet generator 115 includes a reservoir to hold a source material and a nozzle 120 through which target droplets DP of the source material are supplied into the chamber 105.

In some embodiments, the target droplets DP are droplets of tin (Sn), lithium (Li), or an alloy of Sn and Li. In some embodiments, the target droplets DP each have a diameter in a range from about 10 microns ($\mu$m) to about 100 $\mu$m. For example, in an embodiment, the target droplets DP are tin droplets, having a diameter of about 10 $\mu$m to about 100 $\mu$m. In other embodiments, the target droplets DP are tin droplets having a diameter of about 25 $\mu$m to about 50 $\mu$m. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz). In some embodiments, the target droplets DP are supplied at an ejection-frequency of about 100 Hz to about 25 kHz. In other embodiments, the target droplets DP are supplied at an ejection frequency of about 500 Hz to about 10 kHz. The target droplets DP are ejected through the nozzle 127 and into a zone of excitation ZE at a speed in a range of about 10 meters per second (m/s) to about 100 m/s in some embodiments. In some embodiments, the target droplets DP have a speed of about 10 m/s to about 75 m/s. In other embodiments, the target droplets have a speed of about 25 m/s to about 50 m/s.

Referring back to FIG. 1, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 300 includes a carbon dioxide ($CO_2$) or a neodymium-doped yttrium aluminum garnet (Nd:YAG) laser source with a wavelength in the infrared region of the electromagnetic spectrum. For example, the laser light LR1 has a wavelength of 9.4 $\mu$m or 10.6 $\mu$m, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 $\mu$m or less, and the main laser pulses have a spot size in a range of about 150 $\mu$m to about 300 $\mu$m. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplets DP in an embodiment.

The laser light LR2 is directed through windows (or lenses) into the zone of excitation ZE. The windows adopt a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure device 200. A droplet catcher 125 is used for catching excessive target droplets. For example, some target droplets may be purposely missed by the laser pulses.

Referring back to FIG. 1, the collector 110 is designed with a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes an alternating stack of first and second reflective layers (such as a plurality of Mo/Si film pairs) and may further include a capping layer (such as Ru) coated on the alternating stack of reflective layers to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source, the plasma caused by the laser application creates physical debris, such as ions, gases, and atoms of the droplet, as well as the desired EUV radiation. It is necessary to prevent the accumulation of material on the collector 110 and also to prevent physical debris exiting the chamber 105 and entering the exposure device 200.

As shown in FIG. 1, in the present embodiment, a buffer gas is supplied from a first buffer gas supply 130 through the aperture in collector 110 by which the pulse laser is delivered to the tin droplets. In some embodiments, the buffer gas is $H_2$, He, Ar, $N_2$, or another inert gas. In certain embodiments, $H_2$ used as H radicals generated by ionization of the buffer gas is used for cleaning purposes. The buffer gas can also be provided through one or more second buffer gas supplies toward the collector 110 and/or around the edges of the collector 110. Further, the chamber 105 includes one or more gas outlets 140 so that the buffer gas is exhausted outside the chamber 105.

As set forth above, a hydrogen gas is also provided to an environment of the photomask. The hydrogen molecules become radicals by interaction with the EUV radiation, which then penetrate into the photomask. The penetrated hydrogen (or hydrogen radicals) diffuses into the absorber layer and accumulates in the photomask, in particular, at the interface between the reflection mirror layer and the capping layer. The accumulated hydrogen may cause a blister defect, which is a peeling-off of the capping layer from the reflection mirror layer. For example, when the number of wafers exposed by the EUV radiation tool using the photomask exceeds 10,000, the blister defects tend to occur. Therefore, it is beneficial to prevent blister defects caused by the hydrogen permeation as a part of the lithographic process for manufacturing a semiconductor device.

In the present disclosure, to prevent blister defects, an annealing operation on the photomask is employed to release or discharge hydrogen trapped or accumulated in the photomask by the repeated use of the photomask in the EUV lithography tool.

Figure 4:
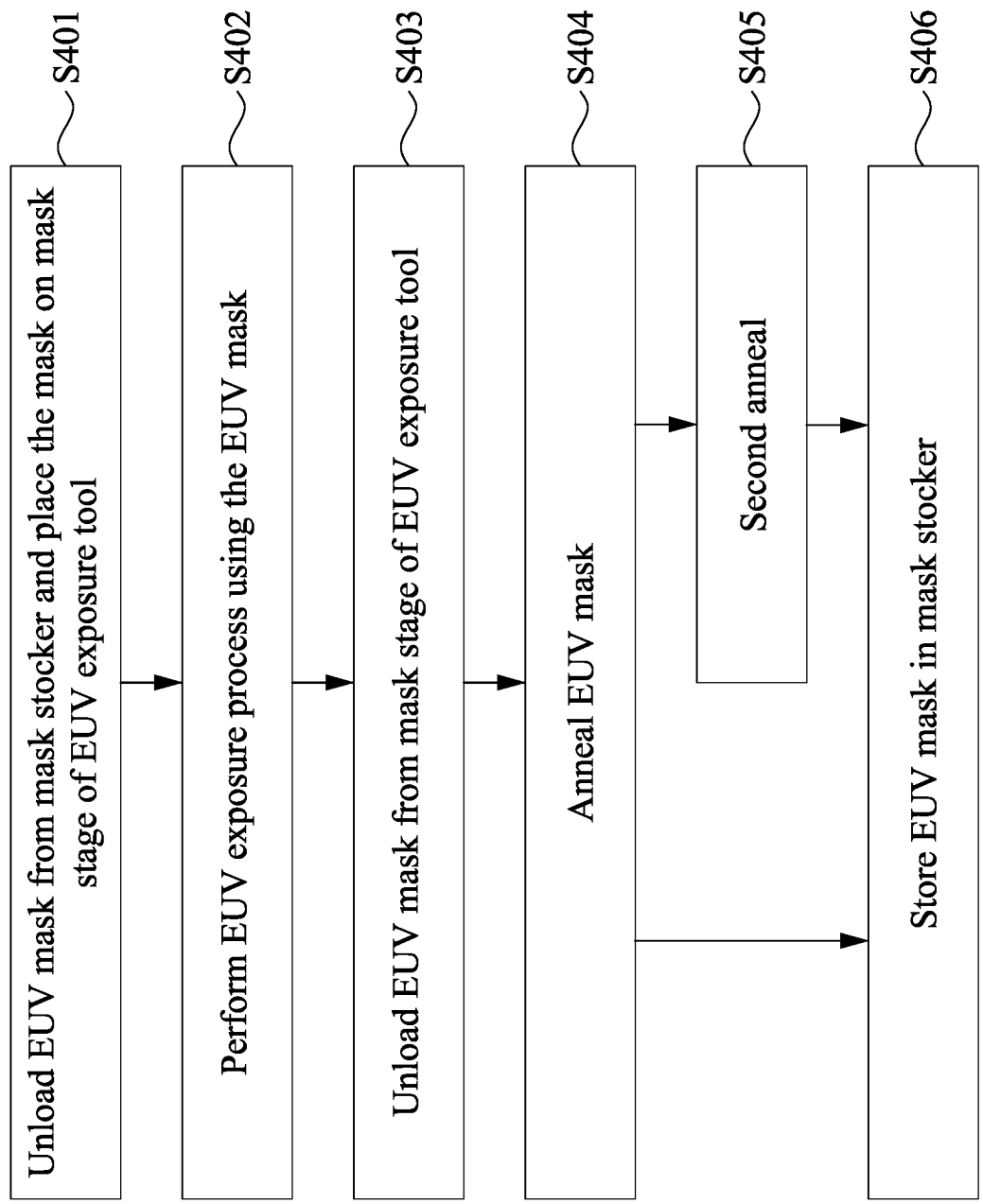
FIG. 4 is a flowchart illustrating a method of treating a photomask according to an embodiment of the disclosure.

FIG. 4 is a flowchart illustrating a method of treating a photomask according to an embodiment of the disclosure. It is understood that additional operations can be provided before, during, and after processes shown by FIG. 4, and some of the operations described below can be replaced or eliminated, for additional embodiments of the method. The order of the operations/processes may be interchangeable.

At S401 of FIG. 4, a photomask to be used is unloaded from a mask stocker and then loaded into an EUV lithography tool (scanner). The photomask is transferred from a load lock chamber (an interface chamber) to a mask stage by a mask handler inside the EUV lithography tool under a reduced pressure (e.g., lower than any pressure between 1 Pa to 1 kPa) in some embodiments. In some embodiments, the photomask is installed into a mask carrier (e.g., a mask POD) having an inner case and an outer case. The inner case is removed from the outer case inside the EUV lithography tool and the photomask is removed from the inner case before being placed on the mask stage, in some embodiments.

Then, at S402, EUV lithography is performed using the photomask to expose a photo resist layer formed over a semiconductor substrate to print circuit patterns formed on the photomask. In some embodiments, one or more batches of semiconductor wafers (each batch includes, e.g., 25 wafers, 40 wafers or more) are processed using the photomask. After the EUV lithography operation is finished, the photomask is removed or unloaded from the mask stage, at S403. At S404, the photomask is heated (annealed) by a heating device. After the annealing, the photomask is cooled down to room temperature (e.g., 25 C°), and then stored in the mask stocker, at S406 of FIG. 4.

In some embodiments, the annealing of the photomask (S404) is performed under a reduced pressure (e.g., lower than any pressure between 1 Pa to 1 kPa). The reduced pressure is equal to or higher than the pressure near the mask stage during the EUV lithography operation. In some embodiments, the annealing is performed at a first temperature in a range from about 100° C. to about 350 C.° to discharge hydrogen from the photomask. When the temperature is below this range, sufficient discharge of the hydrogen may not be obtained, and when the temperature is higher than this range, it may cause cracking or damage to one or more layers of the photomask.

In some embodiments, the annealing time is about one hour to about 5 hours. When the time duration is below this range, there may be insufficient hydrogen discharge, and when the time duration is higher than this range, reduced efficiency of the overall lithography operation and/or reduced productivity of the semiconductor manufacturing operations may result.

In some embodiments, the annealing operation is performed when the cumulative number of exposed wafer reaches or exceeds a threshold number. In some embodiments, the threshold number is any number between 5,000 and 20,000. Until reaching the threshold number, the photomask is unloaded from the EUV exposure tool to the mask stocker without the annealing operation. In other embodiments, every time the photomask is used in the EUV lithography operation, the annealing operation is performed. In some embodiments, the annealing operation is performed after the photomask is unloaded from the mask stocker and before performing the EUV lithography.

In some embodiments, after the annealing operation (first annealing) of the photomask at S404, an additional annealing operation (second annealing) is performed at a second temperature below the first temperature, at S405 of FIG. 4. In some embodiments, the second temperature is in a range from about 80° C. to about 180° C. The time duration for the second annealing is about one hour to about 3 hours in some embodiments.

Figure 5:
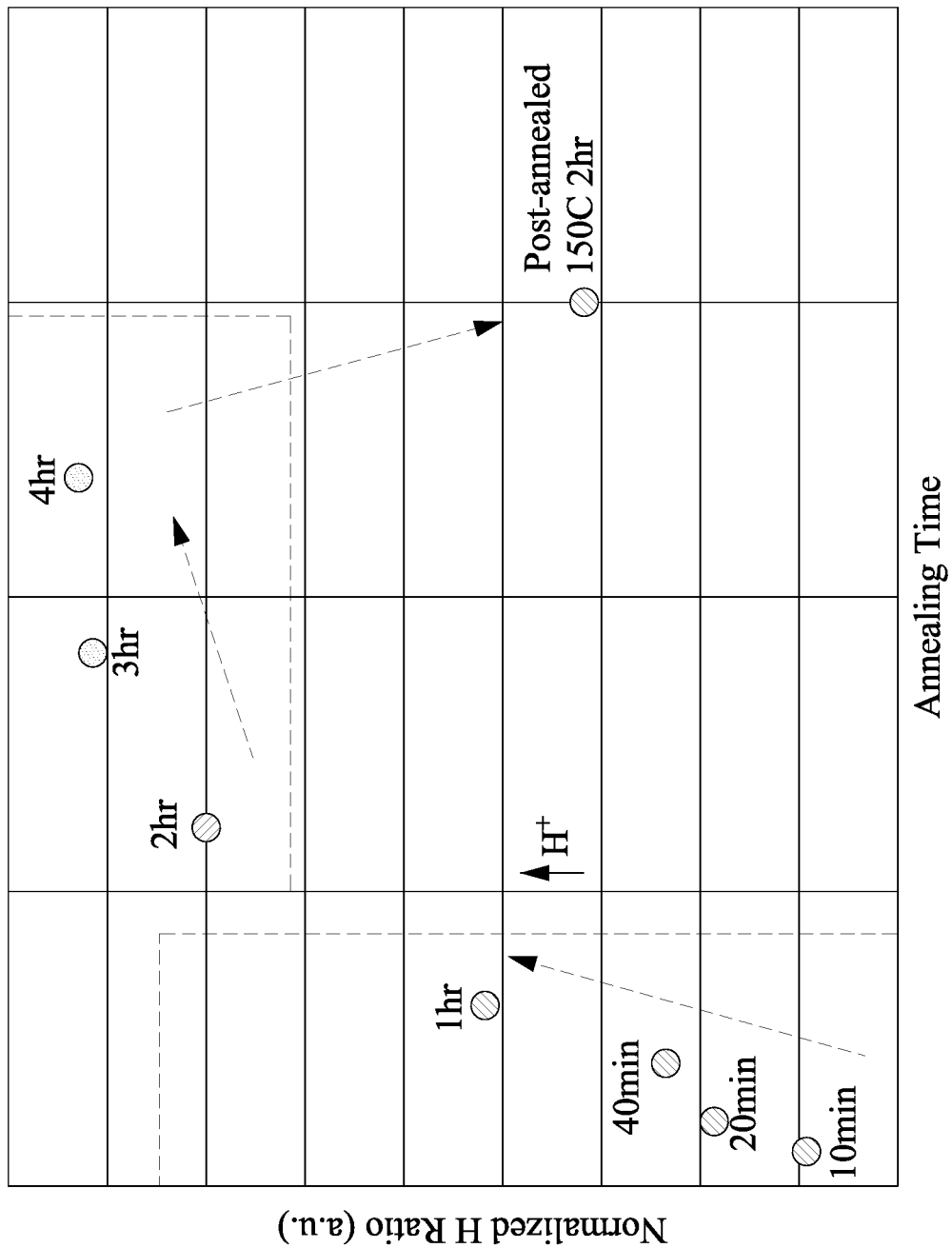
FIG. 5 shows effects of heating a photomask according to an embodiment of the disclosure.

FIG. 5 shows effects of annealing the photomask according to an embodiment of the disclosure. The horizontal axis is an annealing time and the vertical axis shows a normalized cumulative amount of hydrogen detected in an annealing environment, which indicates the amount of hydrogen discharged from the photomask. The amount of hydrogen is obtained by using a blank test mask and a time-of-flight secondary ion mass spectrometry.

As shown in FIG. 5, the amount of hydrogen discharged increases as the annealing time increases, and reaches a maximum value at about 3 hours to about 4 hours. After about four hours of annealing at the first temperature, the amount of hydrogen discharged from the photomask during the second heating (annealing) is greatly reduced, which indicates that a sufficient amount of hydrogen has been discharged by the first annealing.

In some embodiments, a photomask is subjected to a cleaning operation, an inspection operation and/or a repair operation, which may include heating the photomask at the first temperature. However, the annealing operation as set forth above is distinguished from such a heating operation. In some embodiments, the annealing operation of the present disclosure is performed within an hour after the photomask is removed from the mask stage of the EUV lithography tool.

Figure 6:
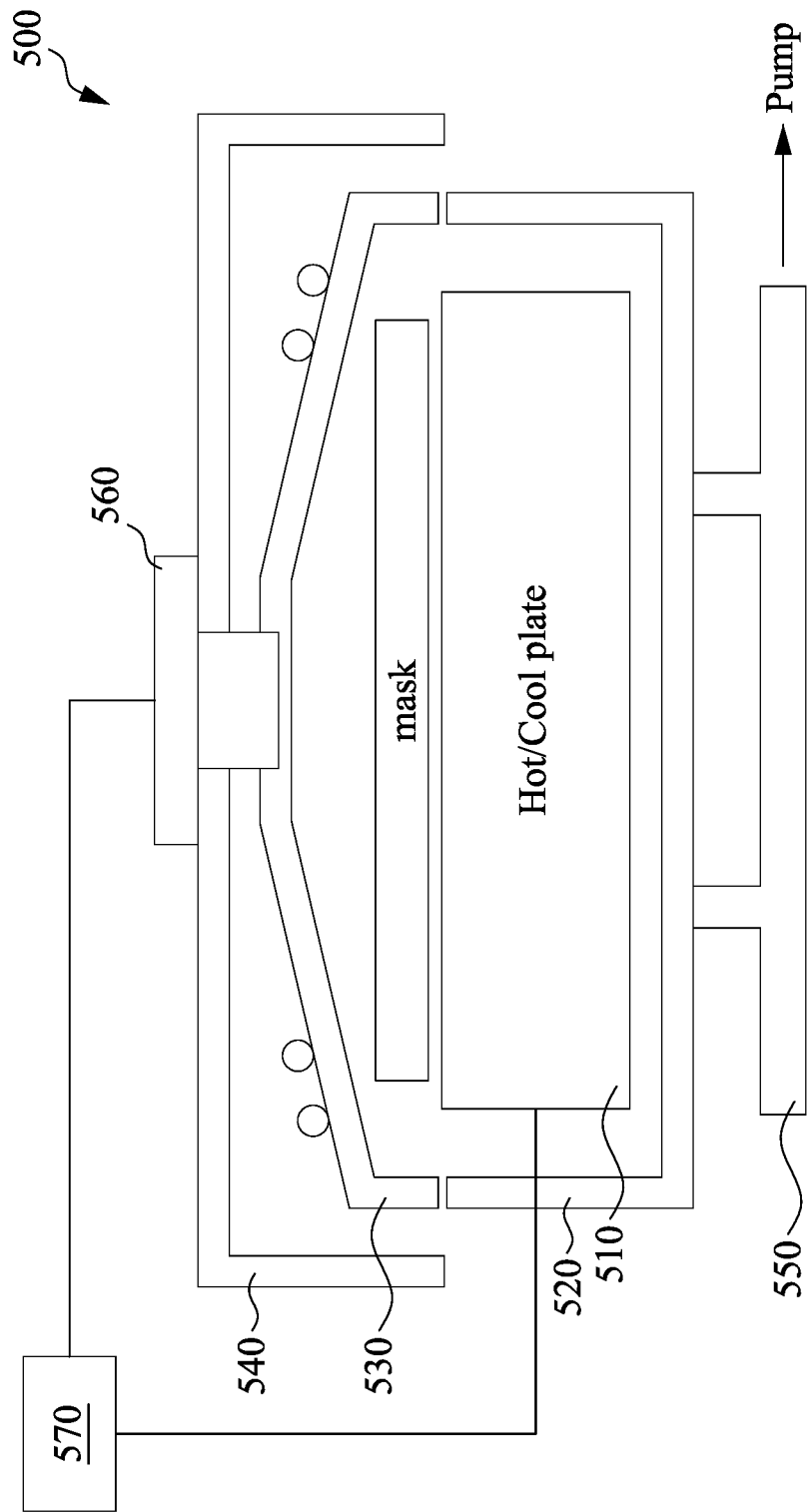
FIG. 6 shows a schematic diagram of a photomask heating apparatus according to an embodiment of the disclosure.

FIG. 6 shows a schematic diagram of a photomask heating apparatus 500 according to an embodiment of the disclosure.

In some embodiments, the photomask heating apparatus 500 includes a mask stage 510, which also includes a heater therein and is enclosed by a chamber having a lower chamber 520 and an upper chamber 530. The lower chamber 520 and the upper chamber 530 constitute a vacuum environment. In some embodiments, a cover 540 is provided over the upper chamber 530. In some embodiments, a gas monitor 560, for example, a hydrogen monitor, is provided to detect hydrogen inside the chamber. Further, a vacuum system 550 coupled to one or more pumps is provided to adjust a pressure inside the chamber. In some embodiments, the gas monitor is a quadrupole mass analyzer or a quadrupole mass spectrometer, or any other sensor that can detect hydrogen.

In some embodiments, the photomask is heated by the heater in the mask stage 510. In other embodiments, the photomask is heated by a heater provided at the upper chamber 530. In other embodiments, the photomask is heated by an infrared lamp provided inside or outside the chamber. In other embodiments, the photomask is heated by an UV lamp, which is also effective to remove hydrocarbon contamination on the photomask.

In some embodiments, the mask stage also functions as a cooling plate. In such a case, a coolant (e.g., water) path is provided inside the mask stage 510. In other embodiments, a cooling plate or stage is separately provided from the mask stage for heating.

In some embodiments, the gas monitor 560 monitors outgas (e.g., hydrogen) from the photomask during the annealing operations. In some embodiments, the gas monitor 560 and the heater is coupled to a controller 570 (e.g., a feedback controller) to control the heater based on the detection result of the outgas. In some embodiments, the heating is stopped when an amount of the outgas reaches a threshold. In other embodiments, the heating is stopped when a decreasing rate of an amount of the outgas reaches a threshold. In some embodiments, the controller stops the heating when a predetermined annealing time duration has passed. In some embodiments, the controller includes a processor and a memory storing a program, and the program executed by the processor causes the controller to perform the control of the photomask heating apparatus 500. In some embodiments, the controller 570 is a part of a control system of the EUV lithography tool.

Figure 7:
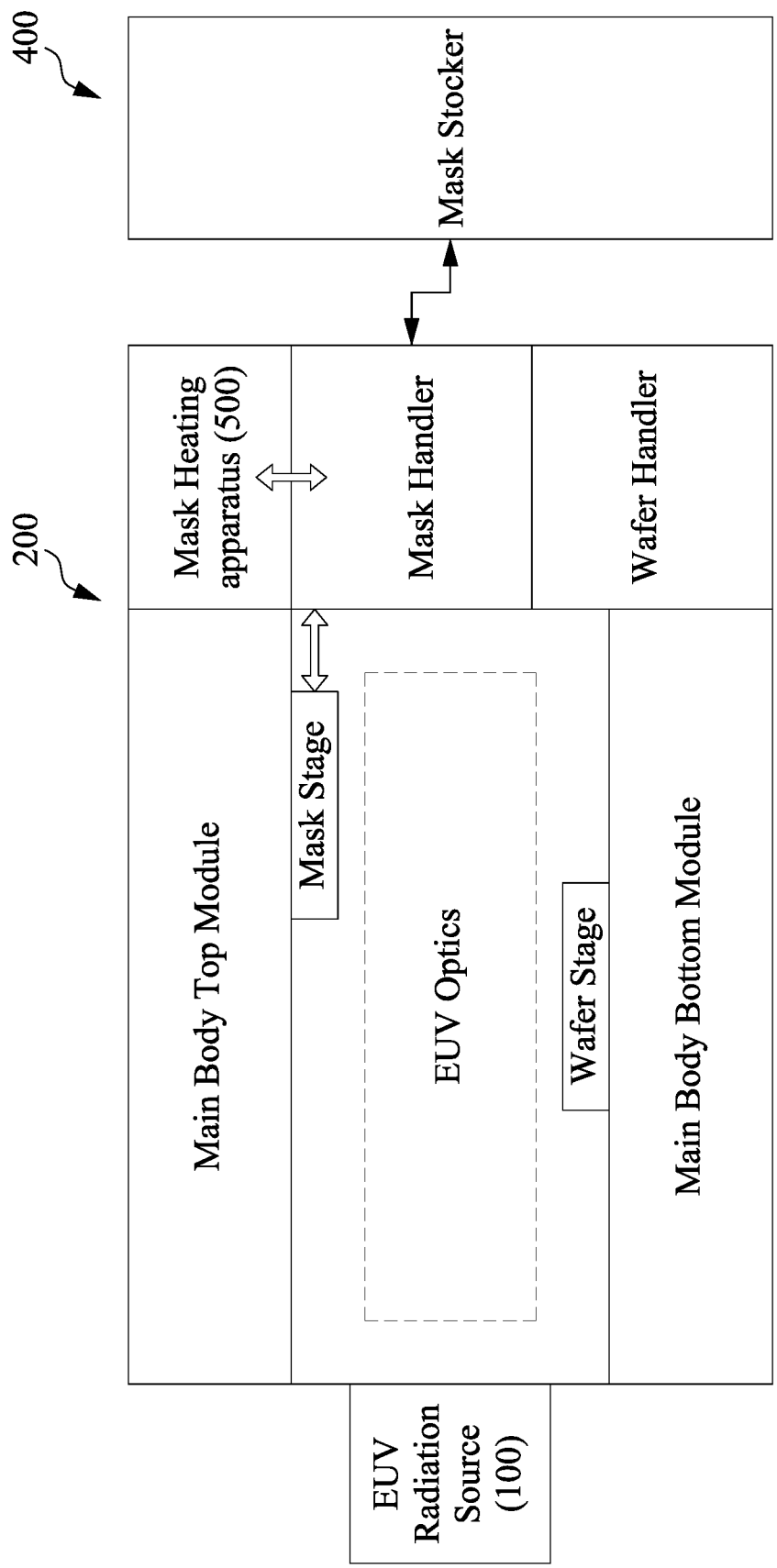
FIG. 7 shows a schematic diagram of a EUV lithography system according to an embodiment of the disclosure.
Figure 8:
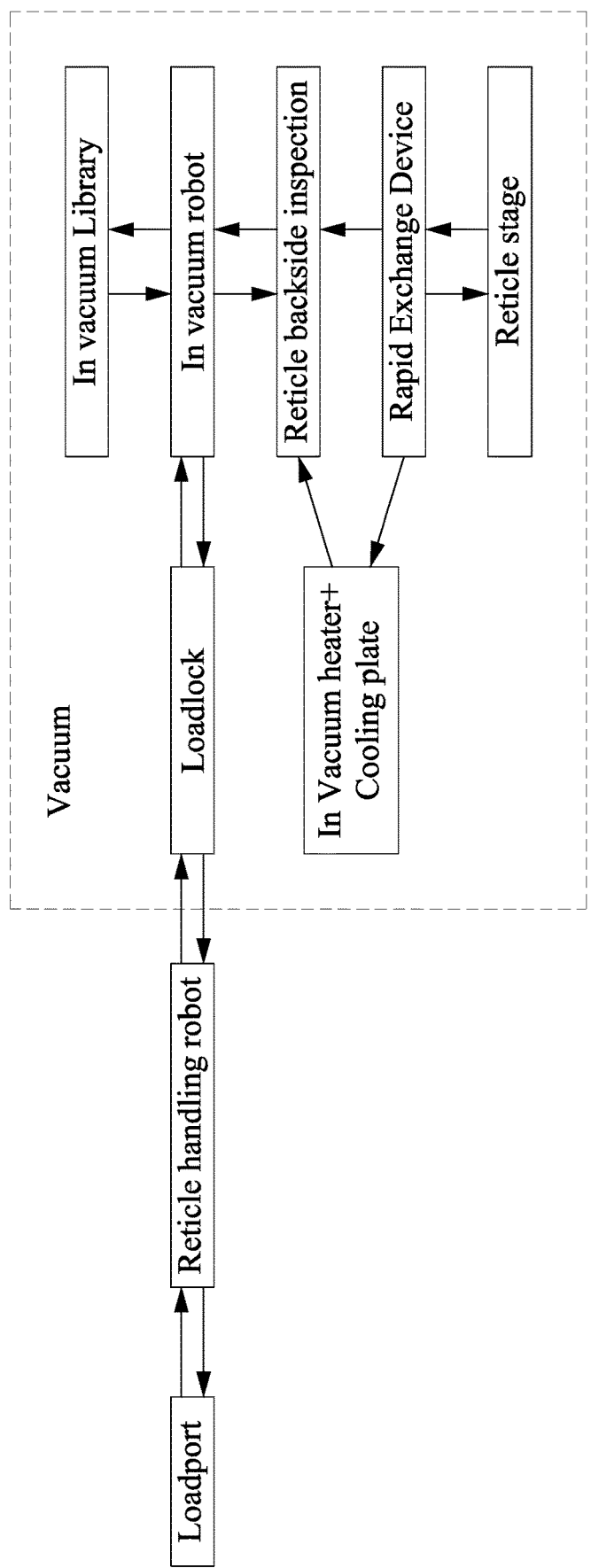
FIG. 8 shows a schematic diagram of a EUV lithography system according to an embodiment of the disclosure.

FIGS. 7 and 8 show schematic diagrams of a EUV lithography system according to an embodiment of the disclosure. Consistent with FIGS. 1, 2A and 2B, the EUV lithography system includes a EUV radiation source apparatus 100 and an EUV lithography tool 200 (e.g., EUV scanner). The EUV lithography tool 200 includes a main body bottom module for controlling a wafer stage, a main body top module for controlling a mask stage, and a reflective EUV optics to direct an EUV beam generated by the EUV radiation source 100 to the photomask held by the mask stage and to direct a reflected EUV beam reflected by the photomask to a wafer held by the wafer stage. Further, the EUV lithography tool 200 includes a wafer handler including one or more robotic arms and a wafer load lock chamber to transfer wafers, and a mask handler including one or more robotic arms and a mask load lock chamber to transfer photomasks.

In some embodiments, the photomask heating apparatus 500 is provided inside the EUV lithography tool 200. In other words, the photomask heating apparatus 500 is integrated into the EUV lithography tool 200.

In the embodiments shown in FIGS. 7 and 8, a photo mask is unloaded from the mask stocker 400, and transferred to a load port of the EUV lithography tool 200 by a mask handling robot outside the vacuum chamber of the EUV lithography tool 200. Then, the photomask is placed into the vacuum environment of the EUV lithography tool through a mask load lock chamber. The photomask is transferred to a mask backside inspection stage by the mask handler (handling robot), and if the inspection result is okay, the photo mask is placed on the mask stage by a mask exchange device, and then an exposure operation is performed.

In some embodiments, after the photomask is removed from the mask stage, the photomask is transferred to the mask heating apparatus 500 under the reduced pressure by the mask handler, and then the first and/or second annealing operations as set forth above are performed in the mask heating apparatus 500. After the photomask is cooled, the photomask is unloaded from the mask heating apparatus 500 and placed into a mask carrier (mask POD device), and the mask carrier is transferred to the mask stocker.

In some embodiments, one or more photomask are stored in a vacuum mask library inside the EUV exposure tool, and the photomask is loaded into and/or unloaded from the vacuum mask library.

Figure 9:
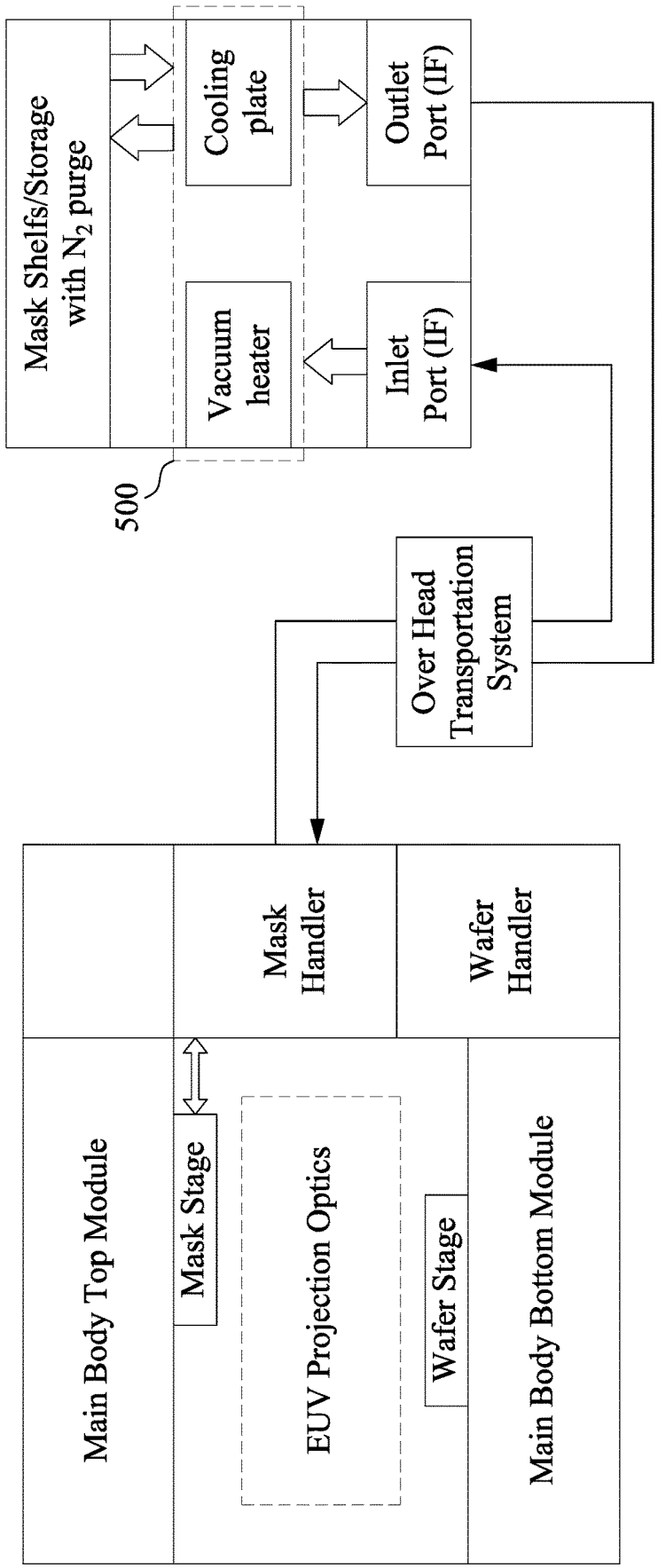
FIG. 9 shows a schematic diagram of a EUV lithography system according to an embodiment of the disclosure.

FIG. 9 shows a schematic diagram of a EUV lithography system according to an embodiment of the disclosure.

In the embodiments of FIG. 9, the photomask heating apparatus 500 is placed inside the mask stocker 400. In some embodiments, after the photomask is removed from the mask stage, the photomask is stored in a mask carrier, and then the mask carrier is transferred by a carrier system, such as an overhead transportation system, to the mask stocker 400. The mask carrier is received by the inlet port, and the mask is removed from the mask carrier. Then the first and/or second annealing operations as set forth above are performed in the mask heating apparatus 500. After the photomask is cooled, the photomask is unloaded from the mask heating apparatus 500 and placed into a mask shelf of the mask stocker 400. In some embodiments, transportation from and/or to the mask heating apparatus 500 is performed under an inert gas ambient (e.g., using $N_2$ purging). The storage of the photomask is also under an inert gas ambient (e.g., using $N_2$ purging) in some embodiments. The pressure inside the mask stocker except for the mask heating apparatus in operation is not necessarily under the reduced pressure, instead the pressure may be atmospheric pressure or slightly higher than the atmospheric pressure.

Figure 10:
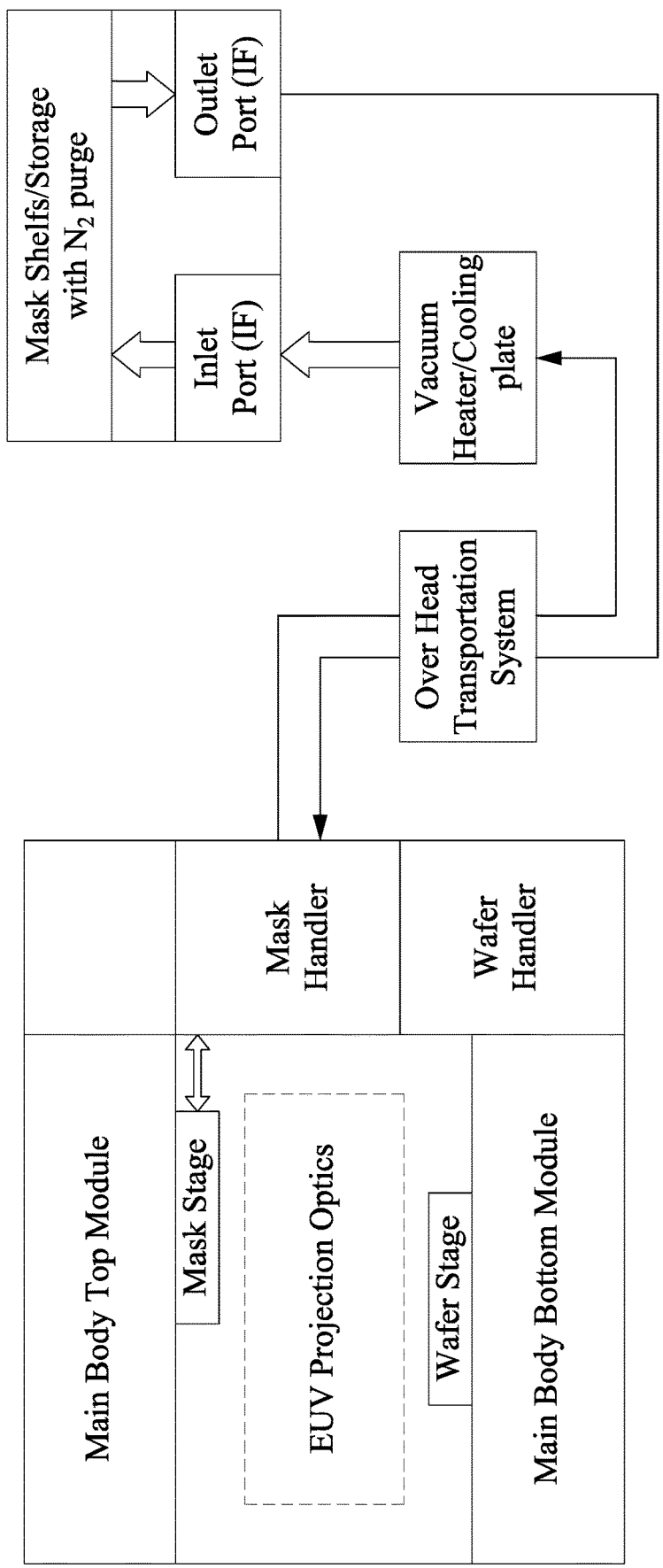
FIG. 10 shows a schematic diagram of a EUV lithography system according to an embodiment of the disclosure.

FIG. 10 shows a schematic diagram of a EUV lithography system according to an embodiment of the disclosure.

In the embodiments of FIG. 10, the photomask heating apparatus 500 is a stand-alone apparatus separately provided from the EUV lithography tool 200 and the mask stocker 400. In some embodiments, after the photomask is removed from the mask stage, the photomask is stored in a mask carrier, and then the mask carrier is transferred by a carrier system, such as an overhead transportation system, to the mask heating apparatus 500. The photomask is removed from the mask carrier inside the mask heating apparatus and then the first and/or second annealing operations as set forth above are performed in the mask heating apparatus 500. After the photomask is cooled, the photomask is unloaded from the mask heating apparatus 500 and transferred to the mask stocker 400. In some embodiments, after the cooling operation, the photomask is placed into a mask carrier and the mask carrier is transported by the overhead transportation system to the mask stocker 400. In other embodiments, transportation from the mask heating apparatus 500 to the mask stocker 400 is performed under an inert gas ambient or under the reduced pressure lower than the atmospheric pressure.

As set forth above, blistering defects are caused by hydrogen accumulated inside the photomask, and the annealing operation can discharge at least part of the accumulated hydrogen from the photomask. In the following embodiments, to enhance the discharge of the hydrogen from the photomask, a dummy pattern having a dimension under a resolution limit of the EUV lithography tool is provided to relatively large opaque areas of the photomask. The opaque area is formed by or covered by an absorber layer and EUV beam is substantially not reflected.

Figure 11A:
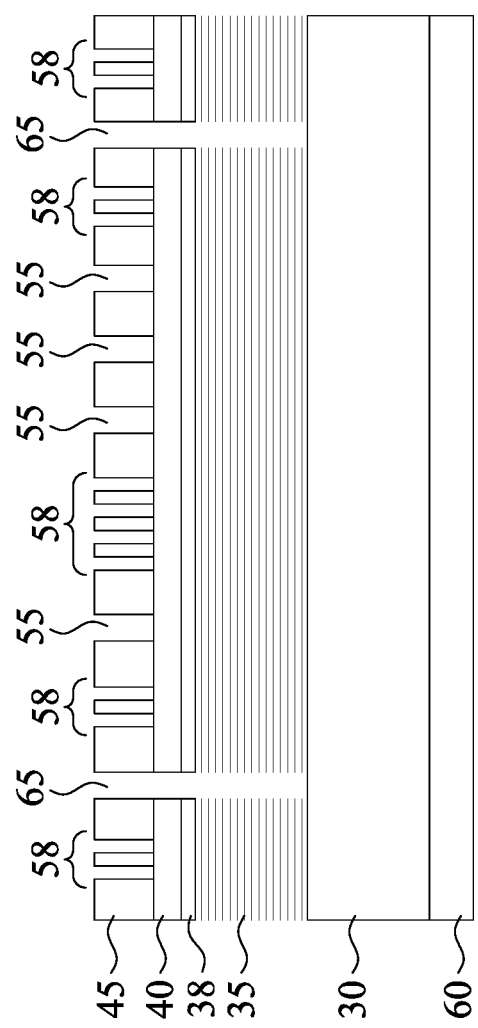
FIGS. 11A and 11B show cross-sectional views of an EUV reflective photomask according to embodiments of the disclosure.
Figure 11B:
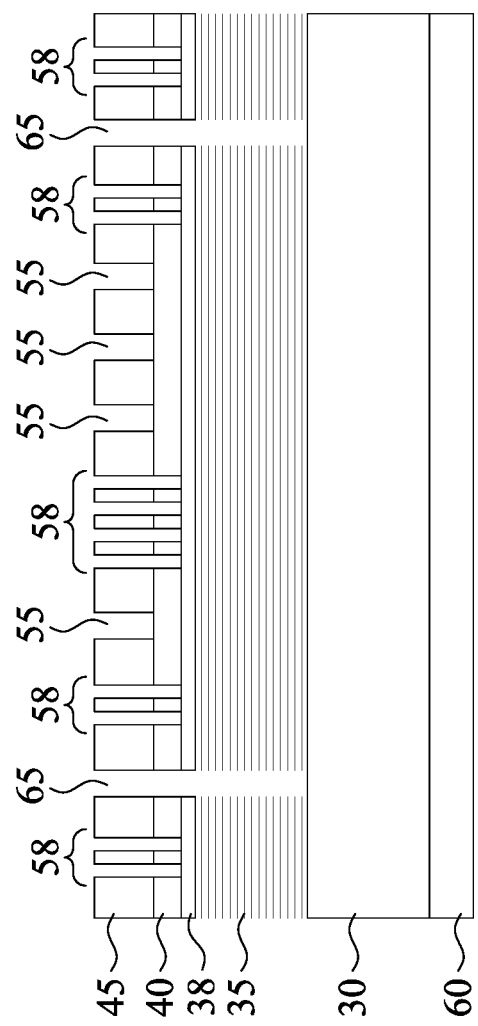

FIGS. 11A and 11B show cross-sectional views of an EUV reflective photomask according to embodiments of the disclosure.

The photomask shown in FIGS. 11A and 11B includes sub-resolution patterns 58, which are not printable in the photo resist layer on the wafer by the EUV radiation tool. In some embodiments, the sub-resolution patterns 58 are formed in the absorber layer and the bottom of the sub-resolution patterns is the capping layer 40, similar to the circuit patterns 55 as shown in FIG. 11A. In other embodiments, the sub-resolution patterns 58 are formed in the absorber layer and the capping layer 40, and the bottom of the sub-resolution patterns is the reflective mirror layer 38 as shown in FIG. 11B.

In some embodiments, the dimension (width or diameter) of the sub-resolution patterns 58 is in a range from about 1 nm to about 10 nm on the wafer (about 4 nm to about 40 nm on the 4×-photomask), and is in a range from about 2.5 nm to about 5 nm on the wafer (about 10 nm to about 20 nm on the 4×-photomask) in other embodiments. If the dimension is smaller than this range, it is difficult to manufacture a photomask with such a small dimension, and if the dimension is greater than this range, the patterns may be printed in the photo resist layer.

Figure 12B:
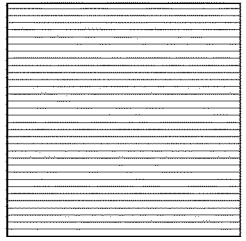
FIGS. 12B, 12C, 12D, 12E and 12F shows sub-resolution patterns used in the EUV reflective photomask according to embodiments of the disclosure
Figure 12C:
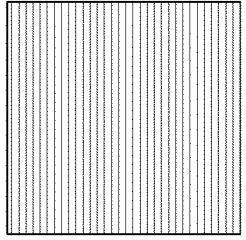
Figure 12D:
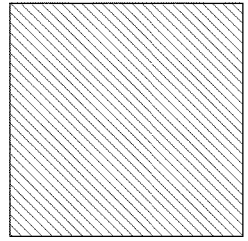
Figure 12E:
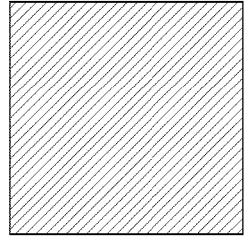
Figure 12F:
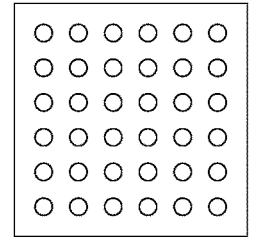

In some embodiments, the sub-resolution patterns 58 includes a periodic pattern, of which the pitch is in a range from about 50 nm to about 200 nm on the wafer (about 200 nm to about 800 nm on the 4×-photomask). In other embodiments, the pitch is about 100 nm to about 150 nm on the wafer (about 400 nm to 600 nm on the 4×-photomask). In some embodiments, the periodic patterns include line and space patterns (see, FIGS. 12B-12E), and in other embodiments the periodic patterns include hole patterns (see, FIG. 12F).

Figure 12A:
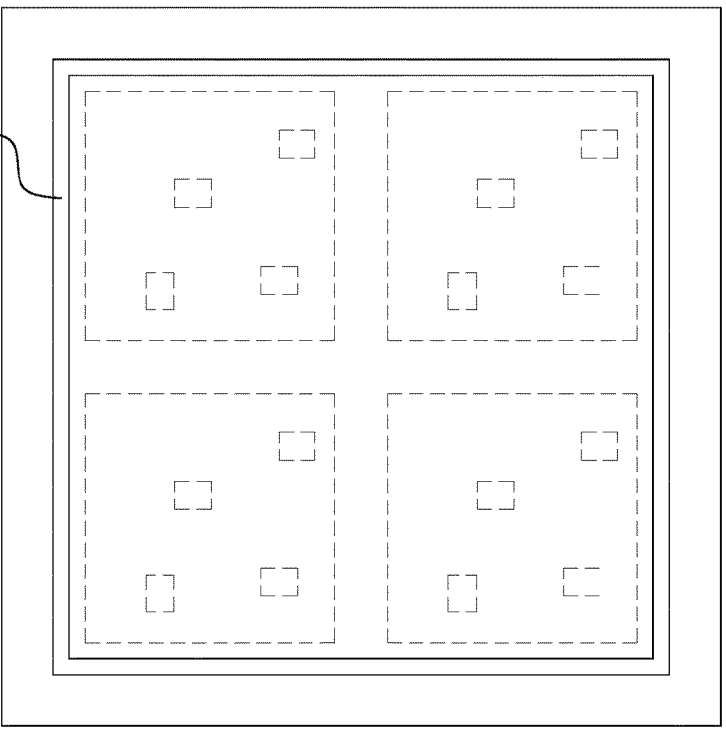
FIG. 12A shows a plan (layout) view of an EUV reflective photomask according to embodiments of the disclosure.

In some embodiments, the sub-resolution patterns are provided to relatively large opaque areas, which are rectangular areas having a shorter side equal to or greater than about 50 μm on the wafer (about 200 μm on the 4X-photomask). In some embodiments, as shown in FIG. 12A, one photomask includes multiple chip areas divided by scribe lane patterns. Although some fine test patterns are provided to the scribe lane patterns, the scribe lane patterns are generally considered as large areas. Further, in some embodiments, each chip includes one or more large areas to which the sub-resolution patterns are provided. In some embodiments, a pattern density (open area (pattern) to the rectangular large area) is about 5% to 40% and is in a range from about 10% to 30% in other embodiments. In addition, the sub-resolution patterns are provided to the absorber layer in the area outside the black border pattern 65. When the photomask includes a test chip (process control module), the sub-resolution patterns are provided to the large areas in the test chip. In some embodiments, a pattern density (the open area (pattern) to the opaque area) of the entire photo mask is about 5% to 50% and is in a range from about 10% to 30% in other embodiments.

In some embodiments, when sub-resolution patterns are provided to a chip area, the sub-resolution patterns are separated from the circuit patterns by a distance from about 3 μm to about 10 μm on the wafer (about 12 μm to about 40 μm on the 4×-photomask). Thus, in some embodiments, the sub-resolution patterns are provided to opaque areas distanced from the circuit pattern by the distance from about 3 μm to about 10 μm.

Figure 13:
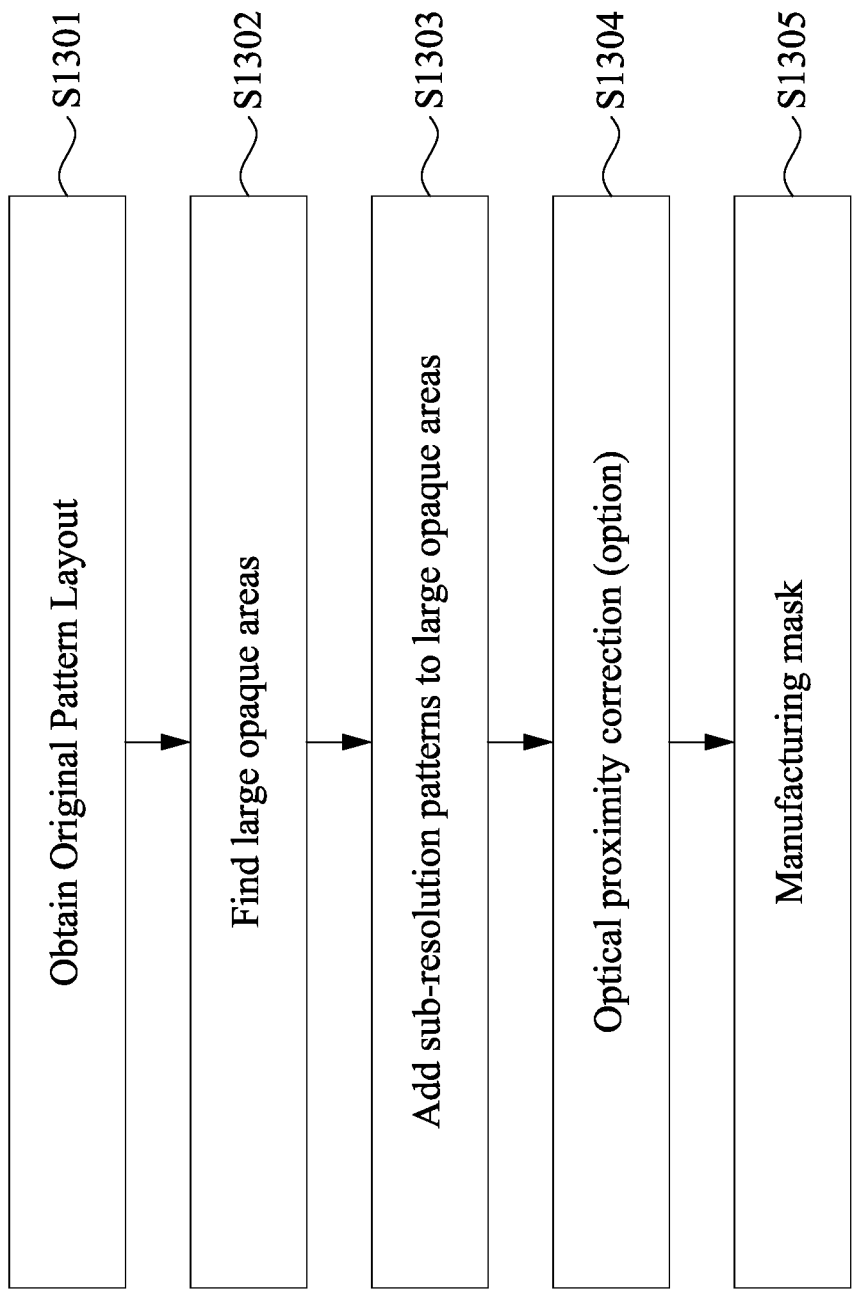
FIG. 13 is a flowchart illustrating a method of manufacturing a photomask according to an embodiment of the disclosure.

FIG. 13 is a flowchart illustrating a method of manufacturing a photomask according to an embodiment of the disclosure. At S1301, an original pattern layout for a photomask is provided. At S1302, by using a mask design computer, large opaque areas with no patterns are found. In some embodiments, the large opaque areas are defined as a rectangle having a shorter side equal to or greater than about 50 μm on a wafer (200 μm on a 4×-photomask). In some embodiments, the computer system finds the large opaque areas by fitting 50×50 μm square patterns. In other embodiments, the large opaque areas are determined by: enlarging circuit patterns by shifting the edges of the circuit pattern (which are to be opening patterns in the photomask) with a first amount in the X and Y directions, where the first amount is about 3 µm to about 10 µm on the wafer); and determining the large areas as the remaining opaque areas not covered by the enlarged circuit patterns. Then, the computer system adds sub-resolution patterns to the found large opaque areas at S1303. In some embodiments, at S1304, an optical proximity correction and/or an electron beam proximity correction are performed. Then, at S1305, a photomask including the circuit patterns and the sub-resolution patterns is manufactured. In some embodiments, after the sub-resolution patterns are added, an optical proximity effect correction process is performed to modify the circuit patterns and/or the sub-resolution patterns. Further, in some embodiments, a design rule-check process is also performed to find any pattern that violates the design rule.

Figure 14A:
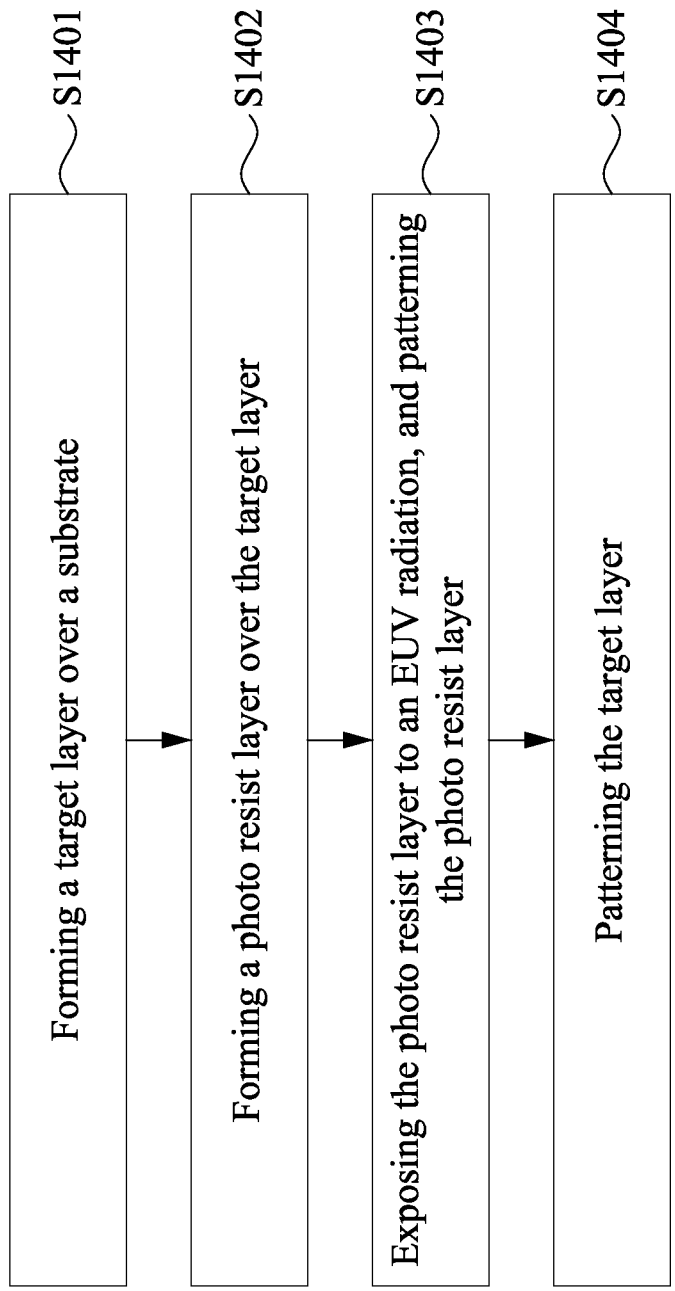
FIG. 14A shows a flowchart of a method making a semiconductor device.

FIG. 14A shows a flowchart of a method making a semiconductor device, and FIGS. 14B, 14C, 14D and 14E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S1401 of FIG. 14A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S1402, of FIG. 14A, a photo resist layer is formed over the target layer, as shown in FIG. 14B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer. At S1403 of FIG. 14A, the photoresist layer is patterned using an EUV reflective mask as set forth above, as shown in FIG. 14B. The patterning of the photoresist layer includes performing a photolithography exposing process by an EUV exposing system using the EUV mask. During the exposing process, the integrated circuit (IC) design pattern defined on the EUV mask is imaged to the photoresist layer to form a latent pattern thereon. The image of the sub-resolution patterns is not printed. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

At S1404 of FIG. 14A, the target layer is patterned utilizing the patterned photoresist layer as an etching mask, as shown in FIG. 14D. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 14E.

In the embodiments of the present disclosure, a reflective EUV photomask is subjected to heating after the use of certain amount of time to discharge accumulated hydrogen therein. Accordingly, blistering defects otherwise caused by the accumulated hydrogen can be suppressed. Further, dummy sub-resolution patterns are provided to large opaque areas of the photomask to facilitate the discharge of the accumulated hydrogen, which also further suppress the blistering defects.

It will be understood that not all advantages have been necessarily discussed herein, no particular advantage is required for all embodiments or examples, and other embodiments or examples may offer different advantages.

According to an embodiment of the present disclosure, in a method of manufacturing a semiconductor device, in an EUV scanner, an EUV lithography operation using an EUV mask is performed on a photo resist layer formed over a semiconductor substrate. After the EUV lithography operation, the EUV mask is unloaded from a mask stage of the EUV scanner. The EUV mask is placed under a reduced pressure below an atmospheric pressure. The EUV mask is heated under the reduced pressure at a first temperature in a range from 100° C. to 350 C°. After the heating, the EUV mask is stored into a mask stocker. In one or more of the foregoing or following embodiments, the reduce pressure is below 1 Pa to 1 kPa. In one or more of the foregoing or following embodiments, the heating is performed for one hour to 5 hours. In one or more of the foregoing or following embodiments, after the heating and before the storing, an annealing at a second temperature below the first temperature is performed. In one or more of the foregoing or following embodiments, the second temperature is in a range from 80° C. to 180 C°. In one or more of the foregoing or following embodiments, the annealing is performed for one hour to 3 hours. In one or more of the foregoing or following embodiments, the heating under the reduced pressure is performed in a chamber provided inside the EUV scanner. In one or more of the foregoing or following embodiments, the heating under the reduced pressure is performed in a chamber provided inside the mask stocker. In one or more of the foregoing or following embodiments, the heating under the reduced pressure is performed in a chamber separately provided from the EUV scanner and the mask stocker. In one or more of the foregoing or following embodiments, the EUV mask is transferred from the mask stage to the chamber under a reduced pressure below the atmospheric pressure.

In accordance with another aspect of the present disclosure, in a method of manufacturing a semiconductor device, in an EUV lithography apparatus, an EUV lithography operation using an EUV mask is performed. After the EUV lithography operation, the EUV mask is unloaded from a mask stage of the EUV lithography apparatus. The EUV mask is heated under a reduced pressure below an atmospheric pressure at a first temperature in a range from 100° C. to 350 C°. After the heating, the EUV mask is stored into a mask stocker. An outgas from the EUV mask is monitored during the heating. In one or more of the foregoing or following embodiments, the outgas is hydrogen. In one or more of the foregoing or following embodiments, the heating is stopped when an amount of the outgas is below a threshold. In one or more of the foregoing or following embodiments, the heating is stopped when a decreasing rate of an amount of the outgas is below a threshold. In one or more of the foregoing or following embodiments, the heating is performed by placing the EUV mask on or over a heating plate. In one or more of the foregoing or following embodiments, during the EUV lithography operation, a hydrogen gas is applied to the EUV mask. In one or more of the foregoing or following embodiments, the mask stocker is purged with nitrogen gas.

In accordance with another aspect of the present disclosure, in a method of manufacturing a semiconductor device, in an EUV lithography apparatus, an EUV lithography operation using an EUV mask is performed. After the EUV lithography operation, the EUV mask is unloaded from a mask stage of the EUV lithography apparatus. The EUV mask is heated under a reduced pressure below an atmospheric pressure at a first temperature in a range from 100° C. to 350 C°. After the heating, the EUV mask is stored into a mask stocker. The EUV mask includes a substrate, a reflective layer comprising multilayers of Si and Mo and disposed over the substrate, one or more intermediate layers disposed over the reflective layer, and an absorber layer disposed over the one or more intermediate layers. The absorber layer includes a plurality of dummy patterns of which dimension is below a resolution limit of the EUV lithography, and at bottoms of the plurality of dummy patterns, one of the one or more intermediate layers is exposed. In one or more of the foregoing or following embodiments, the dimension of the plurality of dummy patterns is 4 nm to 40 nm on the EUV mask. In one or more of the foregoing or following embodiments, the one or more intermediate layer includes a silicon oxide layer on the reflective layer and a Ru layer on the silicon oxide layer, and at bottoms of the plurality of dummy patterns, the silicon oxide layer is exposed. In one or more of the foregoing or following embodiments, the plurality of dummy patterns include periodical patterns having a pitch of 100 nm to 1000 nm on the EUV mask. In one or more of the foregoing or following embodiments, the pitch is 400 nm to 600 nm on the EUV mask. In one or more of the foregoing or following embodiments, the periodical patterns includes line and space patterns or hole patterns. In one or more of the foregoing or following embodiments, the plurality of dummy patterns are provided on a rectangular area having a shorter side equal to or greater than 200 µm on the EUV mask. In one or more of the foregoing or following embodiments, the plurality of dummy patterns are separated from a circuit pattern formed in the absorber layer by a distance from 12 µm to 40 µm on the EUV mask. In one or more of the foregoing or following embodiments, the plurality of dummy patterns are provide on a scribe line pattern. In one or more of the foregoing or following embodiments, a pattern density of the plurality of dummy patterns is 40% to 60%.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    performing, in an extreme ultraviolet (EUV) scanner, an EUV lithography operation using an EUV mask on a photo resist layer formed over a semiconductor substrate;
    after the EUV lithography operation, unloading the EUV mask from a mask stage of the EUV scanner;
    placing the EUV mask under a reduced pressure below an atmospheric pressure;
    heating the EUV mask under the reduced pressure at a first temperature in a range from 100° C. to 350° C.;
    after the heating, annealing the EUV mask at a second temperature below the first temperature; and
    after the annealing, storing the EUV mask in a mask stocker.

2. The method of claim 1, wherein the reduced pressure is below 1 kPa.

3. The method of claim 1, wherein the heating is performed for one hour to 5 hours.

4. The method of claim 1, wherein the second temperature is in a range from 80° C. to 180° C.

5. The method of claim 4, wherein the annealing is performed for one hour to 3 hours.

6. The method of claim 1, wherein the heating under the reduced pressure is performed in a chamber provided inside the EUV scanner.

7. The method of claim 6, wherein the EUV mask is transferred from the mask stage to the chamber under a reduced pressure below the atmospheric pressure.

8. The method of claim 1, wherein the heating under the reduced pressure is performed in a chamber provided inside the mask stocker.

9. The method of claim 1, wherein the heating under the reduced pressure is performed in a chamber separately provided from the EUV scanner and the mask stocker.

10. A method of manufacturing a semiconductor device, comprising:
    performing, in an extreme ultraviolet (EUV) lithography apparatus, an EUV lithography operation using an EUV mask;
    after the EUV lithography operation, unloading the EUV mask from a mask stage of the EUV lithography apparatus;
    heating the EUV mask under a reduced pressure below an atmospheric pressure at a first temperature in a range from 100° C. to 350° C. using a heater;
    monitoring a hydrogen outgas from the EUV mask during the heating;
    controlling the heater based on a detection result of monitoring the hydrogen outgas; and
    after the heating, storing the EUV mask into a mask stocker.

11. The method of claim 10, wherein the heating is stopped when an amount of the outgas is below a threshold.

12. The method of claim 10, wherein the heating is stopped when a decreasing rate of an amount of the outgas is below a threshold.

13. The method of claim 10, wherein:
the heater is a heating plate, and
the heating is performed by placing the EUV mask on or over the heating plate.

14. The method of claim 10, wherein during the EUV lithography operation, a hydrogen gas is applied to the EUV mask.

15. The method of claim 10, wherein the mask stocker is purged with nitrogen gas.

16. A method of manufacturing a semiconductor device, comprising:
performing, in an extreme ultraviolet (EUV) lithography apparatus, an EUV lithography operation using an EUV mask;
after the EUV lithography operation, unloading the EUV mask from a mask stage of the EUV lithography apparatus;
heating the EUV mask under a reduced pressure below an atmospheric pressure at a first temperature in a range from 100° C. to 350° C.;
after the heating, annealing the EUV mask at a second temperature below the first temperature; and
after the annealing, storing the EUV mask in a mask stocker,
wherein the EUV mask comprises:
a substrate;
a reflective layer comprising multilayers of Si and Mo and disposed over the substrate;
one or more intermediate layers disposed over the reflective layer; and
an absorber layer disposed over the one or more intermediate layers,
the absorber layer includes a plurality of dummy patterns having a dimension which is below a resolution limit of the EUV lithography, and
at bottoms of the plurality of dummy patterns, one of the one or more intermediate layers is exposed.

17. The method of claim 16, wherein the dimension of the plurality of dummy patterns is 4 nm to 40 nm on the EUV mask.

18. The method of claim 16, wherein:
the one or more intermediate layer includes a silicon oxide layer on the reflective layer and a Ru layer on the silicon oxide layer, and
at bottoms of the plurality of dummy patterns, the silicon oxide layer is exposed.

19. The method of claim 16, further comprising monitoring a hydrogen outgas from the EUV mask during the heating.

20. The method of claim 19, further comprising stopping the heating based on a detection result of monitoring the hydrogen outgas.

* * * * *